United States Patent
Pomerene et al.

(10) Patent No.: US 9,105,772 B2
(45) Date of Patent: Aug. 11, 2015

(54) IN-LINE GERMANIUM AVALANCHE PHOTODETECTOR

(71) Applicant: BAE Systems Information and Electronic Systems Integration Inc., Nashua, NH (US)

(72) Inventors: Andrew T S Pomerene, Leesburg, VA (US); Vu A. Vu, Falls Church, VA (US); Robert L. Kamocsai, Manassas, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 95 days.

(21) Appl. No.: 13/953,050

(22) Filed: Jul. 29, 2013

(65) Prior Publication Data
US 2014/0029892 A1 Jan. 30, 2014

Related U.S. Application Data

(60) Provisional application No. 61/677,297, filed on Jul. 30, 2012.

(51) Int. Cl.
*G02B 6/122* (2006.01)
*G02B 6/42* (2006.01)
*H01L 31/0232* (2014.01)
*H01L 31/18* (2006.01)
*H01L 31/107* (2006.01)

(52) U.S. Cl.
CPC ............ *H01L 31/0232* (2013.01); *G02B 6/122* (2013.01); *G02B 6/4295* (2013.01); *H01L 31/107* (2013.01); *H01L 31/18* (2013.01); *H01L 31/1804* (2013.01)

(58) Field of Classification Search
CPC .............................. G02B 6/122; G02B 6/4295
See application file for complete search history.

(56) References Cited

U.S. PATENT DOCUMENTS

| | | | |
|---|---|---|---|
| 6,710,378 B1 | 3/2004 | Makiuchi et al. | |
| 2008/0105940 A1* | 5/2008 | Piede et al. | 257/432 |
| 2013/0001643 A1 | 1/2013 | Yagi | |

* cited by examiner

*Primary Examiner* — Jerry Rahll
(74) *Attorney, Agent, or Firm* — Daniel J. Long

(57) ABSTRACT

A method for manufacturing a photodetector including growing a quantity of germanium within an optical pathway of a waveguide. The detection of a current caused by an interaction between the optical signal and the germanium is used to indicate the presence of an optical signal passing through the waveguide.

14 Claims, 8 Drawing Sheets

IN-LINE GERMANIUM AVALANCHE PHOTODETECTOR

RELATED APPLICATIONS

This Application claims rights under 35 U.S.C. §119(e) from U.S. Application Ser. No. 61/677,297 filed Jul. 30, 2012, the contents of which are incorporated herein by reference.

TECHNICAL FIELD

Various embodiments described herein relate to integrated circuits generally, including devices, methods, and systems for detecting optical signals.

BACKGROUND

Photodetectors are devices that sense the presence of light or other electromagnetic energy. A PIN diode is one example of a photodetector. The PIN diode detects the presence of an optical signal when the optical signal contacts the intrinsic region of the diode freeing an electron or hole. An external power source applies voltage to P-type and N-type regions of the diode causing the freed electrons or holes to be swept from the intrinsic region producing a current. This electrical current indicates the presence of light or other electromagnetic energy entering the detector.

Typically, photodetectors are designed to absorb the optical signal inducing an electron or hole to be released from the intrinsic region. Such a design results in the optical signal terminating upon contact with the intrinsic region of the photodetector. As advances in technology focus on reducing the size of electronic devices, integrated circuits need to be designed with consideration towards the interface between various circuit components. Improvements are always desired in any art.

SUMMARY

We recognize that what is needed is a photodetector that can detect the presence of an optical signal without terminating the optical signal and allowing the optical signal to be applied to other integrated circuit applications or functions. In accordance with the present disclosure the problem of detecting optical signals by terminating optical signals is solved by an in-line germanium photodetector located within a waveguide.

This device allows the optical signal to contact the germanium region of the photodetector without terminating the optical signal because the germanium absorbs some, but not all, of the optical signal. Rather, upon contacting the germanium region of the photodetector the majority of the original optical signal is directed through the remaining portion of the waveguide with minimal signal distortion. When the optical signal exits the waveguide, the signal may be applied to other integrated circuit functions. The ability to use one optical signal for multiple functions allows circuit designers to develop smaller integrated circuits having fewer components to accomplish multiple circuit tasks.

We have also recognized that there is a need for methods of detecting optical signals without distorting the optical signal and allowing that signal to be applied to other integrated circuit applications. In accordance with the present disclosure, the problem of detecting optical signals without significant signal distortion or termination is solved by transmitting at least one optical signal through a waveguide to interact with a germanium photodetector without terminating the optical signal.

Furthermore, we have also recognized that the present methods for manufacturing photodetectors contribute to the problem of detecting optical signals without distorting the optical signal. Therefore, in accordance with the present disclosure the problem of manufacturing photodetectors that do not significantly distort or terminate an optical signal is solved by growing a quantity of germanium within an optical pathway of a waveguide wherein the presence of an optical signal is detected and the optical signal is allowed to pass through the waveguide.

If desired, particular embodiments may include growing the germanium to achieve an electric field having a desired strength when operating the device. A particular electric field strength may be desired in applications where device requirements specify a particular response time or there is a limited amount of external voltage available. Other embodiments of the present disclosure include modifying the geometry of the waveguide at the input and output of the device to minimize unwanted optical signal reflections.

The subject matter of the present disclosure may be used to particular advantage when applied in telecommunications systems. These systems typically receive and transmit data using optical signals. The problem of creating smaller and more efficient telecommunications system is solved by a telecommunications system having an integrated circuit that incorporates a waveguide having an optical pathway for transmitting a quantity of optical signals. Within this pathway may be installed a quantity of germanium that detects the presence of at least one optical signal without terminating the optical signal when an external voltage is applied to the device. As a result, one optical signal may be applied to multiple integrated circuit functions. The number of integrated circuit components may now be reduced or the same number of integrated circuit components may be re-allocated to other functions without increasing the overall integrated circuit size.

BRIEF DESCRIPTION OF THE DRAWINGS

Other objects, features and advantages will occur to those skilled in the art from the following description and accompanying drawings, in which.

DETAILED DESCRIPTION

Figure 1:
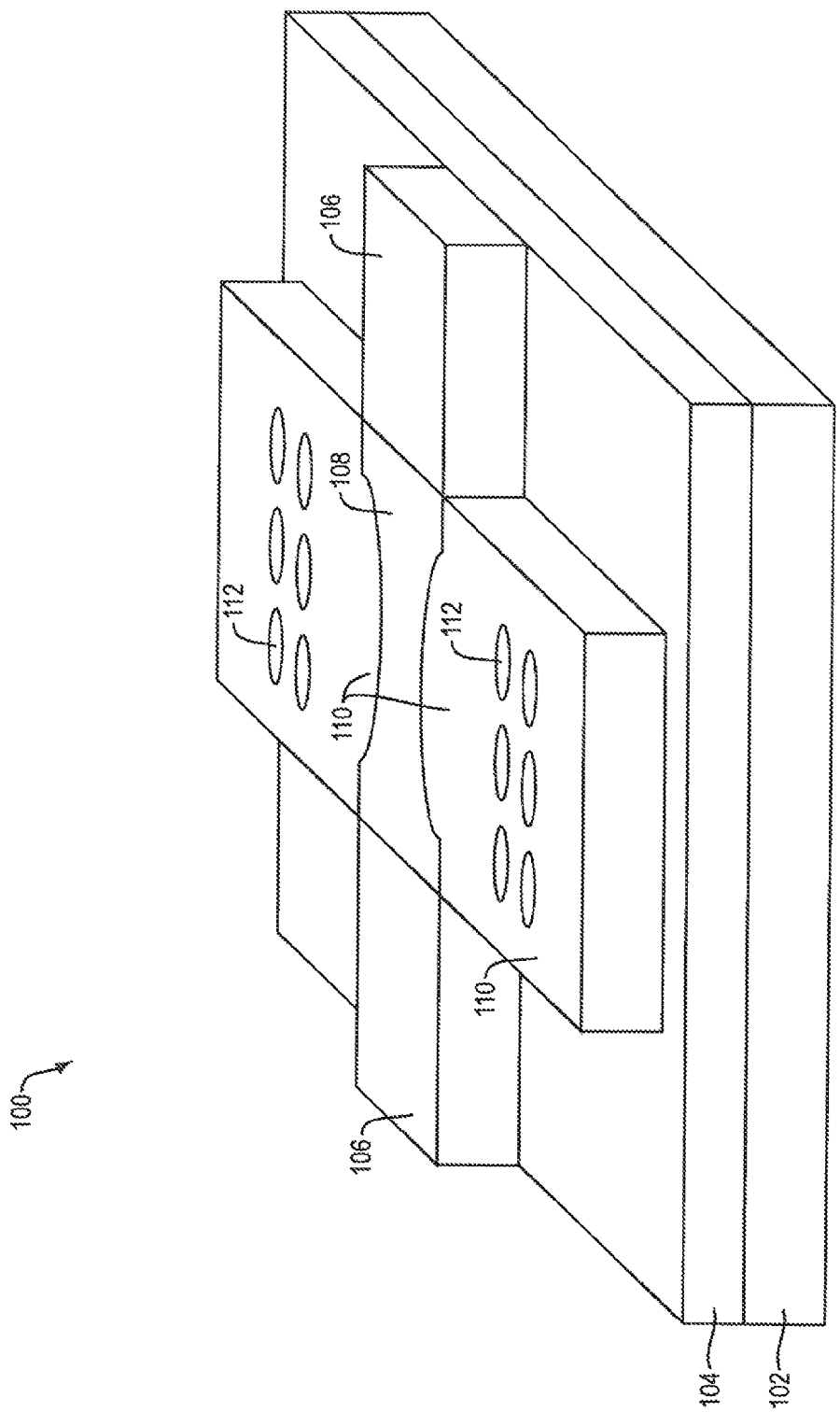
FIG. 1 is a three-dimensional view of an exemplary embodiment of an in-line germanium photodetector.

FIG. 1 is a three-dimensional view of an in-line germanium photodetector 100 according to an exemplary embodiment of the present disclosure. The in-line germanium photodetector 100 may include but is not limited to a structural layer 102, an insulating layer 104, a silicon waveguide 106, an intrinsic germanium region 108, implant regions 110 and electrical connections 112.

The structural layer 102 supports the various components of the in-line germanium photodetector 100. In the exemplary embodiment of the present disclosure, the structural layer 102 is made of silicon. Other materials may be suitable for use as structural layers 102, as long as, those materials are capable of supporting other device components and can interface with other integrated circuit components.

The insulating layer 104 electrically isolates the structural layer 102 from a silicon layer on top of the insulating layer. In the preferred embodiment of the present disclosure the insulating layer 104 is the buried oxide of an SOI wafer. The insulating layer 104 along with the structural layer 102 supports the remaining components of the in-line germanium photodetector 100, including the waveguide 106.

The waveguide 106 receives optical signals and directs those optical signals to and from the germanium region 108 of the in-line germanium photodetector 100. In the exemplary embodiment of the present disclosure, the regions of the device adjacent to the germanium region on both sides are made of silicon. The waveguide 106 may be manufactured using etching and patterning techniques, such as, photolithography or photoengraving. The waveguide 106 is to have a shape capable of receiving and transmitting optical signals and containing the germanium region 108.

In the preferred embodiment of the present disclosure, the waveguide 106 includes an optical pathway for receiving and transmitting optical signals. Moreover, a portion of the optical pathway is modified to receive the germanium region 108 of the in-line germanium photodetector 100.

The germanium region 108 of the in-line germanium photodetector 100 receives the optical signals from the waveguide 106. The optical signal interacts with the germanium region 108. Some photons in the optical signal are lost when the signal interacts with the germanium, but we assume that this number is small relative to the number of photons that continue through the waveguide 106. The optical signal then continues through and exits the waveguide 106. As a result, the optical signals may be used for other integrated circuit functions. In the preferred embodiment of the present disclosure, the optical signals pass through the waveguide 106 by entering a first waveguide end and exit through a second waveguide end.

Electrons and holes are generated in the germanium region 108 of the in-line germanium photodetector 100 when the optical signal interacts with the germanium. Under the influence of the applied electric field, the electrons and holes generated in the germanium region 108 travel to the extrinsic regions of the device. If the electric field is large enough, the electrons and holes will cause more electrons and hole pairs to be generated and an avalanching effect takes place. The large number of additional electrons and holes generated by the avalanching effect assures that a strong electrical signal will be detected even when the original number of electrons and holes generated directly by the optical signal is small.

In the preferred embodiment of the present disclosure, the width of the germanium region 108 of the in-line germanium photodetector 100 is purposely made narrow to increase the electric field generated by an applied voltage across that width. A high electric field is desirable to quickly remove the electrons and holes generated in the germanium region 108. Quick removal of these particles is desirable in order to minimize distortion of the optical signal. The strength of this electric field is inversely proportional to the width of the germanium region 108 which is the intrinsic region of a reverse biased PIN diode. In other embodiments of the present disclosure, the width of the germanium region 108 may vary depending on desired operating characteristics for the in-line germanium photodetector 100. The germanium region 108, however, should be designed such that the electric field is large enough to remove electrons and holes at rate high enough that the electrons and holes cause minimal distortion to the optical signal.

The implant regions 110 receive the electrons and holes generated in the germanium region 108 of the in-line germanium photodetector 100 when the optical signal interacts with the germanium material. In the preferred embodiment of this disclosure, the implant regions are adjacent to the germanium region 108.

The implant regions 110 may be manufactured from materials capable of receiving an ion implantation or another semiconductor doping processes. In the exemplary embodiment of the present disclosure, the implant regions 110 are both silicon, but one is implanted creating a P-type silicon region and the other is implanted creating an N-type silicon region. For this embodiment the in-line germanium photodetector 100 detects the presence of an optical signal when positive and negative voltages are applied across the germanium material to the N-type and P-type regions, respectively, to sweep out electrons and holes created when the optical signal interacts with the germanium region 108. In this way, the P-type silicon, germanium, and N-type silicon materials form a reverse-biased avalanche photodiode when the optical signal contacts the intrinsic germanium region 108. No net current flows through this PIN diode when the optical signal is not present in the germanium region 108.

Electrical connections 112 may be installed within the implant regions 110 to receive the electrons and holes that are released from the germanium region 108 of the in-line germanium photodetector 100. In the preferred embodiment of the present disclosure the electrical connections 112 may be contacts, vias, and metal wiring. In some embodiments of the present disclosure the electrical connections 112 may be connected to an integrated circuit where the electrons and holes may be counted.

In addition to receiving electrons and holes, the electrical connections 112 may be used to apply a voltage across the germanium region 108 creating the electric field that motivates the electrons and holes to move out of the germanium region 108. This voltage, however, is to be a suitable value for use with integrated circuit components. A voltage value of 5V is typically associated with integrated circuits and may be used to provide a sufficient electric field across the germanium region 108. A sufficiently strong electric field is important, because the stronger the electric field, the faster the electrons and holes are removed from germanium region 108. The lingering presence of these electrons and holes within the germanium region 108 may cause optical signal disturbances.

Figure 2:
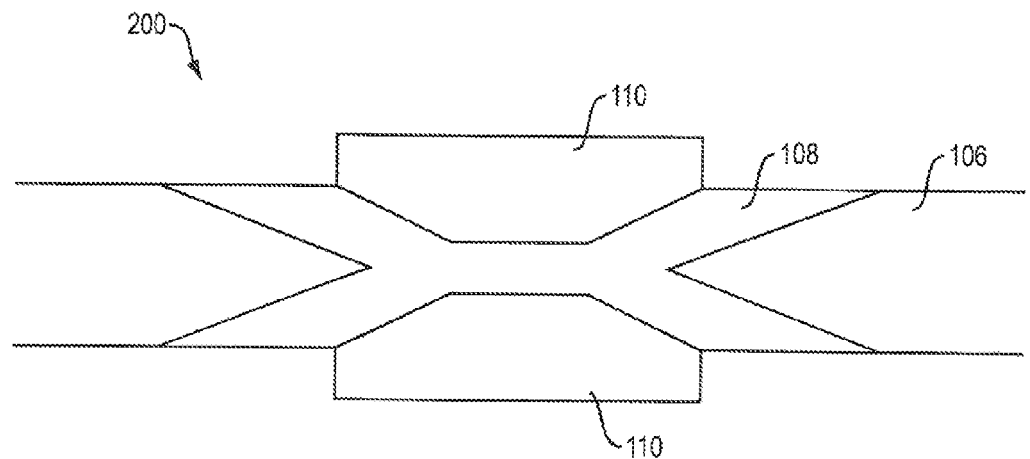
FIG. 2 is a two-dimensional view of an exemplary embodiment of the in-line germanium photodetector having interfaces designed to reduce optical signal disturbances.

FIG. 2 is a two-dimensional view of an exemplary embodiment of the in-line germanium photodetector 200 where the interfaces between germanium region 108 and the waveguide 106 are designed to reduce unwanted optical signal reflections. Unwanted reflections of the optical signal may occur when the optical signal transitions from one material to another. To reduce these unwanted signal disturbances at least one interface between the germanium region 108 and the waveguide 106 may gradually transition from one material to another.

Figure 3:
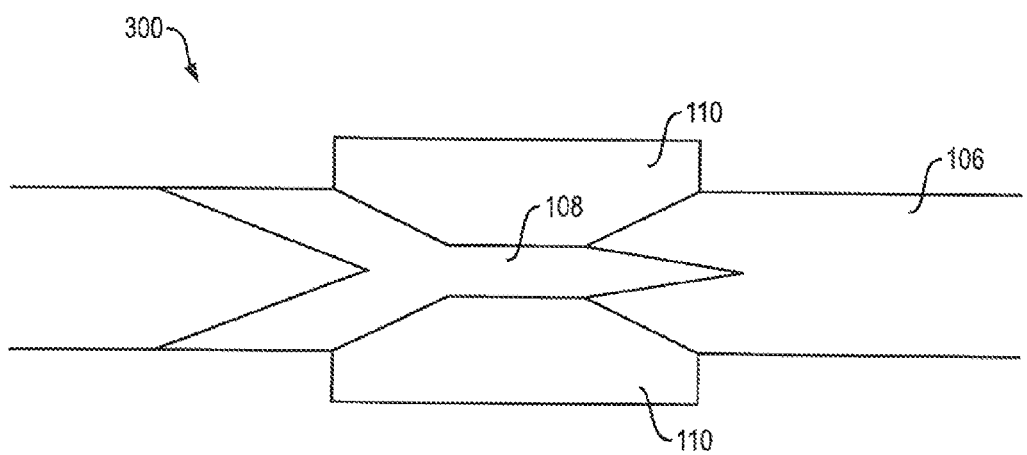
FIG. 3 is a two-dimensional view illustrating an alternate embodiment of the in-line germanium photodetector having interfaces designed to reduce optical signal disturbances.
Figure 4:
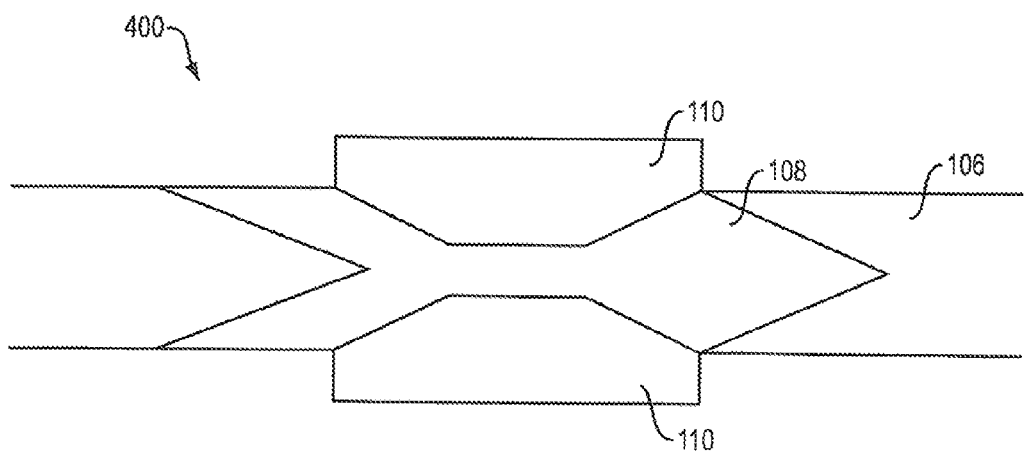
FIG. 4 is a two-dimensional view illustrating an alternate embodiment of the in-line germanium photodetector having interfaces designed to reduce optical signal disturbances.

Gradually transitioning from one material to another minimizes the change in the index of refraction that produces some of the unwanted optical signal disturbances. An optical signal experiences some reflection wherever the index of refraction changes abruptly. These unwanted optical signal reflections, however, may be reduced by gradually transitioning from the germanium region 108 to the silicon waveguide 106. Gradual changes to the index of refraction may be achieved by slowly introducing the material receiving the optical signal along the interface between the germanium region 108 and silicon waveguide 106 as shown in FIGS. 3 and 4. An interface may be defined as a location where the index of refraction changes from the index of refraction of silicon 106 to the index of refraction of germanium region 108. The interface may also be defined as the location where the waveguide 106 and germanium region 108 join together.

Figure 5:
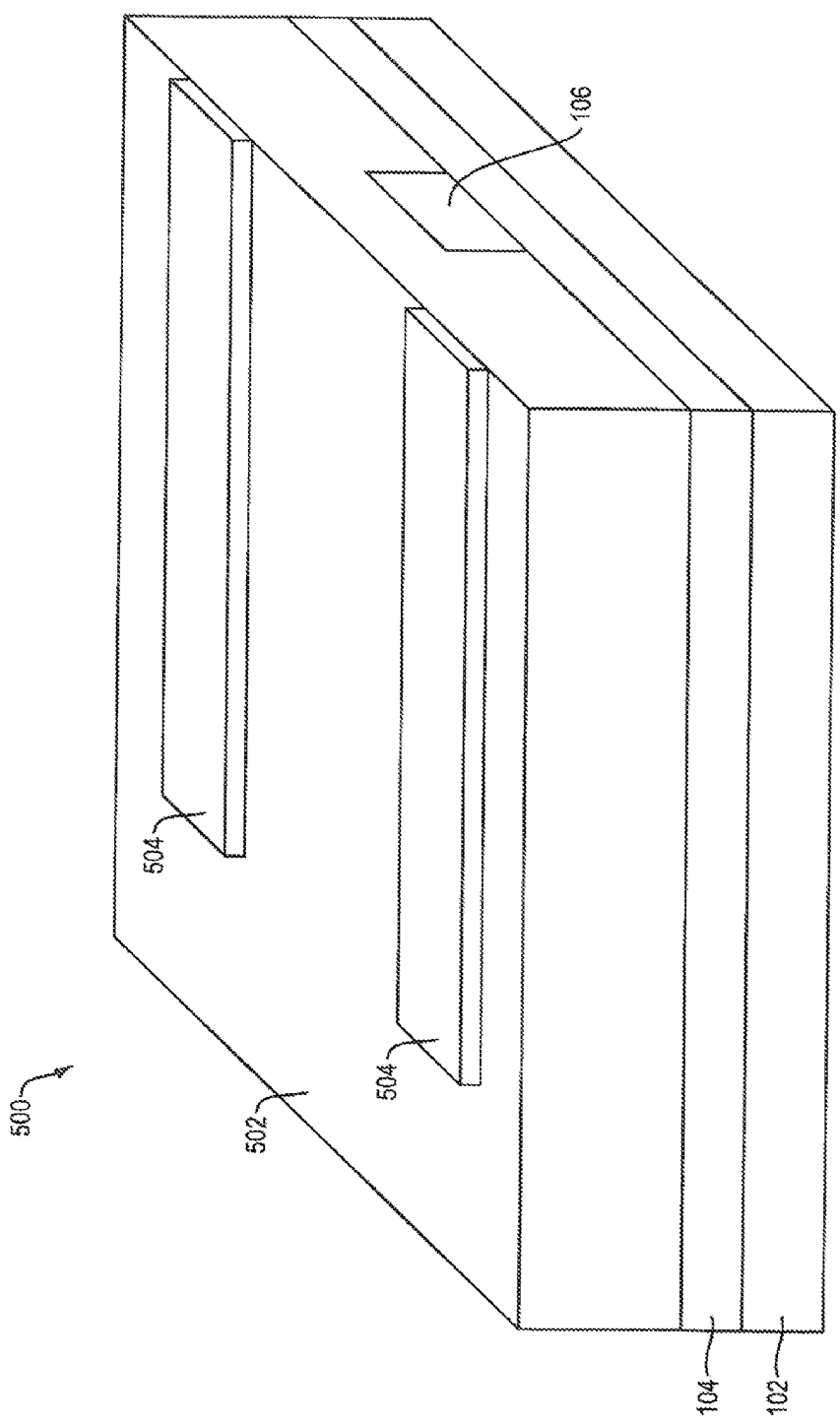
FIG. 5 is a three-dimensional view of an exemplary embodiment of an in-line germanium photodetector having metal lines and a protective layer installed over the germanium photodetector.

FIG. 5 is a three-dimensional view of an exemplary embodiment of the in-line germanium photodetector 500 having protective layer 502 and metal lines 504 connected to the implant regions 110 by vias underneath those metal lines.

In the preferred embodiment of the present disclosure the protective layer 502 is tetracethyl orthosilicate (TEOS). TEOS is an electrical insulator. Holes, called vias, may be etched in the protective layer 502. These vias may be then filled with a metallic material. The vias form a conduit for receiving the electrons and holes that are released from the germanium region 108. Moreover, those electrons and holes may be transferred to the metal lines 504.

On top of the protective layer 502 are metal lines 504 that electrically connect the photodetector 500 to other integrated circuit components. In the exemplary embodiment of the present disclosure, the metal lines 504 cover the tops of all the vias located within the protective layer 502.

Figure 6:
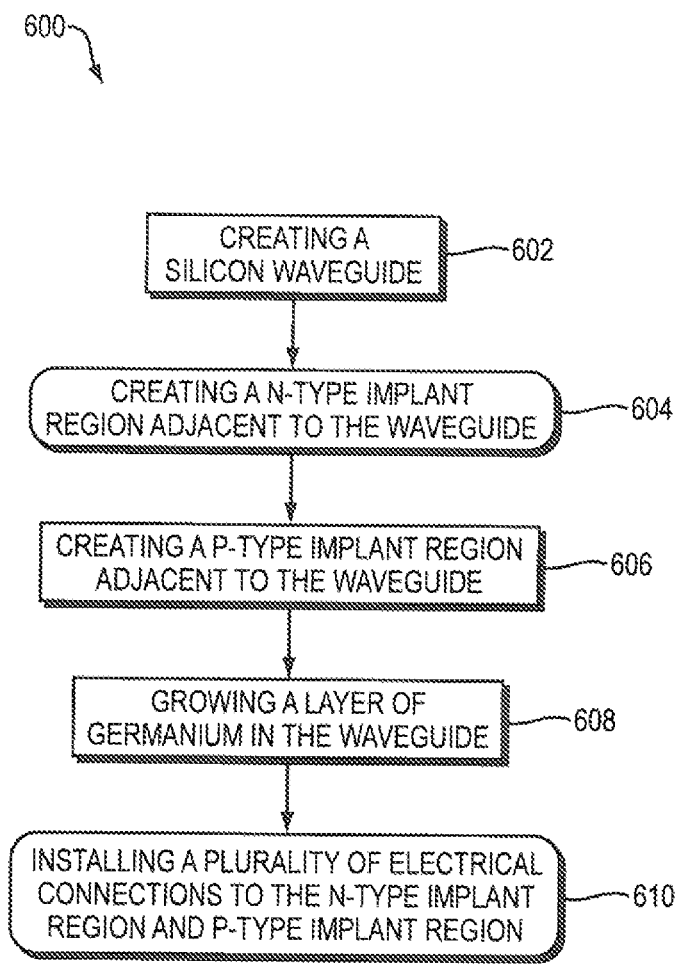
FIG. 6 is a flow chart of a method for manufacturing an in-line germanium photodetector.

FIG. 6 is a flow chart of a method for manufacturing an in-line germanium photodetector 600. At block 602 a silicon waveguide is created. In the preferred embodiment of the present disclosure, a layer of thermal oxide is grown on top of an SOI wafer. The top layer of silicon and the thermal oxide are photo-lithographically patterned and etched to create a silicon waveguide. During the etching process, a portion of the waveguide is modified to have an increased width. This wider portion of the waveguide is the region where the photodetector is to be located. One region of this widened portion of the waveguide will later be implanted with N-type ions. Another region of this widened portion of the waveguide will later be implanted with P-type ions.

Figure 7A:
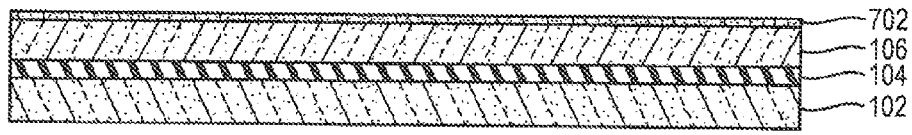
FIG. 7A is a side view of the layer of thermal oxide grown on the waveguide.
Figure 7B:
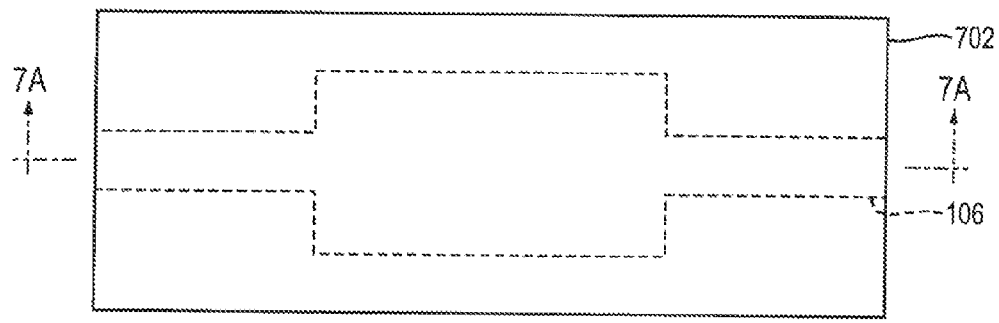
FIG. 7B is a top view of the layer of thermal oxide grown on the waveguide.
Figure 8A:
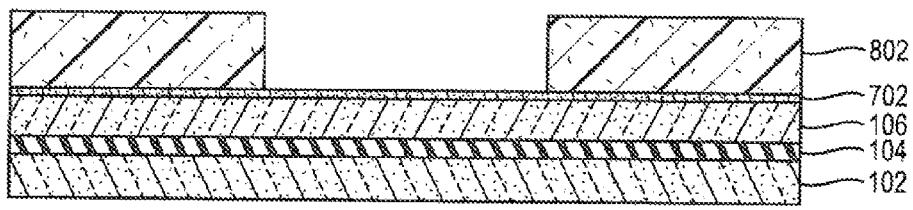
FIG. 8A is a side view of the first implant region after photoresist has been applied and patterned.
Figure 8B:
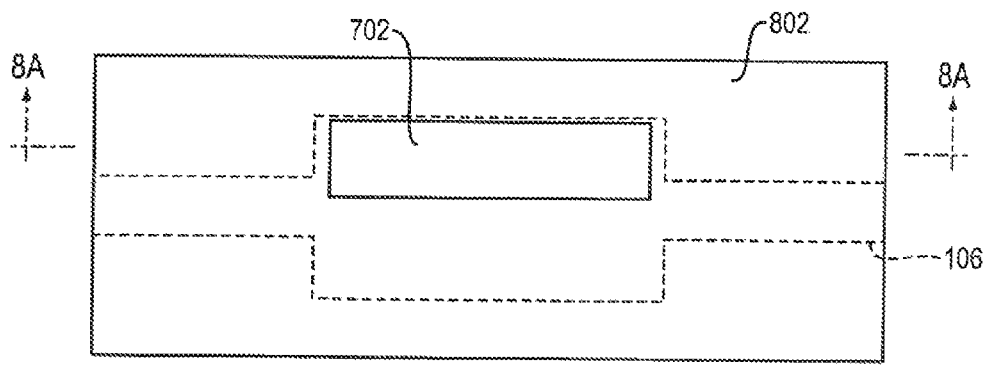
FIG. 8B is a top view of the first implant region after photoresist has been applied and patterned.
Figure 9:
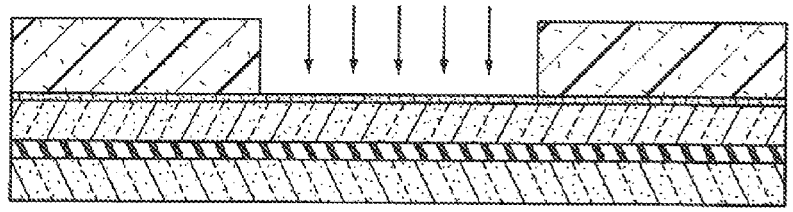
FIG. 9 is a side view illustrating doping the implant regions by implanting ions into the implant regions.

At Block 604, the layer of thermal oxide 702 previously grown on the top of the SOI wafer is still present on top of the silicon waveguide, as shown in FIGS. 7A and 7B, and will act as an implant screen. A photoresist 802 may be applied on top of the thermal oxide layer 702. The resist may then be patterned as shown on FIGS. 8A and 8B. The photoresist 802 is patterned to mask the entire device except the region that will be implanted with N-type ions. In the preferred embodiment of the present disclosure, the N-type implant region is located adjacent to the region of the photodetector that will be composed of germanium. The N-type region is created by implanting ions by electrostatically accelerating N-type ions into the unmasked implant region as shown in FIG. 9. The photoresist 802 may then be removed from the top of the waveguide.

Figure 10A:
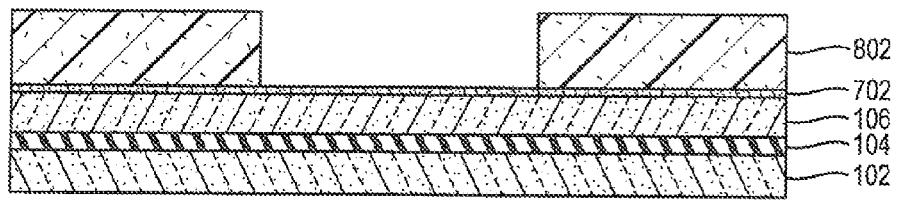
FIG. 10A is a side view of the second implant region after photoresist has been applied and patterned.
Figure 10B:
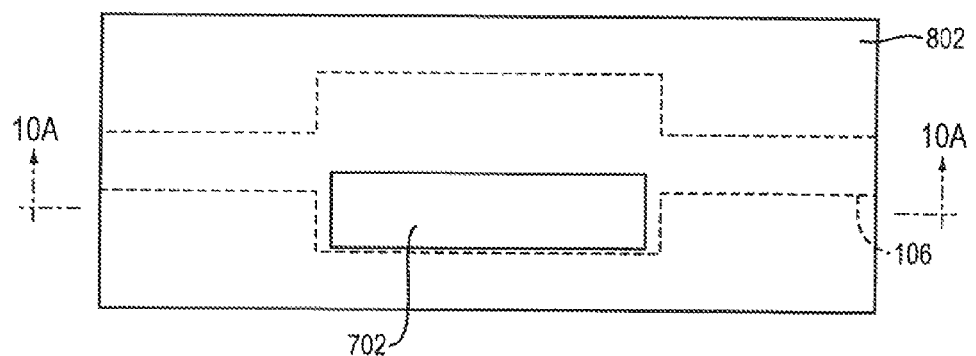
FIG. 10B is a top view of the second implant region after photoresist has been applied and patterned.

At Block 606 with the layer of thermal oxide 702 remaining on the waveguide, a photoresist 802 may again be applied on top of the thermal oxide layer 702 and patterned as shown on FIGS. 10A and 10B. The photoresist 802 is patterned to mask the entire device except the region that will be implanted with P-type ions. In the preferred embodiment of the present disclosure, the P-type implant region is located adjacent to the region of the photodetector that will be composed of germanium and opposite the N-type implant region. Similar to the N-type implantation, a P-type implantation is performed by electrostatically accelerating P-type ions into the unmasked implant region as shown in FIGS. 10A and 10B. Afterwards, the photoresist 802 and the thermal oxide layer 702 may be removed.

Figure 11A:
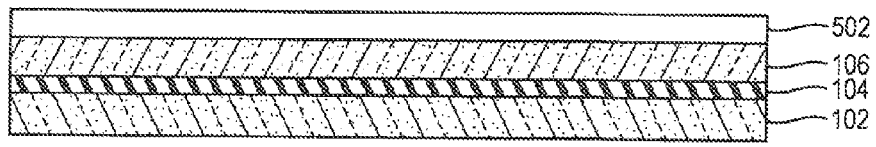
FIG. 11A is a side view of the protective layer applied to the waveguide after the photoresist has been removed.
Figure 11B:
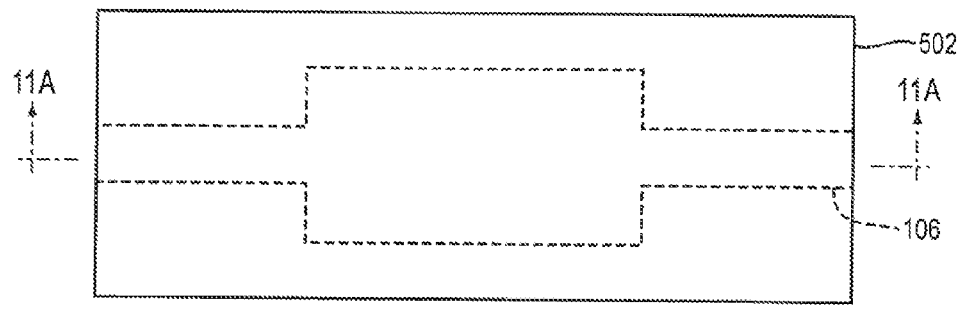
FIG. 11B is a top view of the protective layer applied to the waveguide after the photoresist has been removed.

In some embodiments of the present disclosure, a protective layer may be deposited onto the waveguide as shown in FIGS. 11A and 11B. In the preferred embodiment of the present disclosure a layer of tetraethyl orthosilicate (TEOS) is applied to the device. This TEOS layer may be chemical-mechanically polished (CMP). Photoresist is then applied and patterned, and the TEOS layer and the silicon waveguide under the TEOS is etched in the region where germanium will be grown. The etching process does not completely remove material down to the buried oxide, but stops inside the silicon. After stripping the photoresist, germanium is grown on the exposed silicon.

Figure 12A:
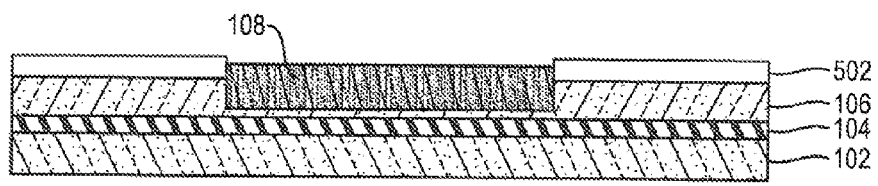
FIG. 12A is a side view of the quantity of germanium grown on the exposed silicon of the waveguide after the protective layer and some silicon has been etched.
Figure 12B:
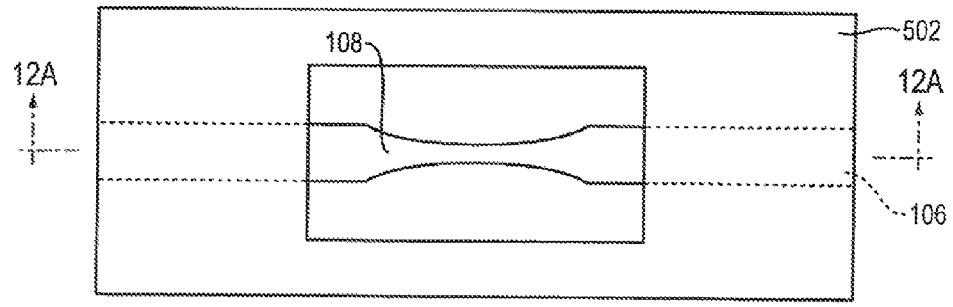
FIG. 12B is a top view of the quantity of germanium grown on the exposed silicon of the waveguide after the protective layer and some silicon has been etched.

At Block 608 a quantity of germanium is grown in the photodetector region of the waveguide as shown in FIGS. 12A and 12B. The germanium is grown in line with the silicon waveguide 106, so that an optical signal in the waveguide will travel from silicon into germanium and then back into silicon where the optical signal continues to travel on to another part of the optical circuit. The germanium only grows in the photodetector region where the silicon was left exposed after being etched. Germanium does not grow on the TEOS layer. In the some embodiments of the present disclosure, the width of the germanium region may be fashioned to achieve a desired electric-field strength when a predetermined voltage is applied across the germanium region. The strength of the electric field will be inversely proportional to the width of the germanium region. In yet other embodiments, the germanium may be grown creating an interface between the germanium and the waveguide that gradually transitions to reduce a quantity of unwanted optical signal reflections produced when the optical signal transfers to and from germanium and the waveguide.

Figure 13A:
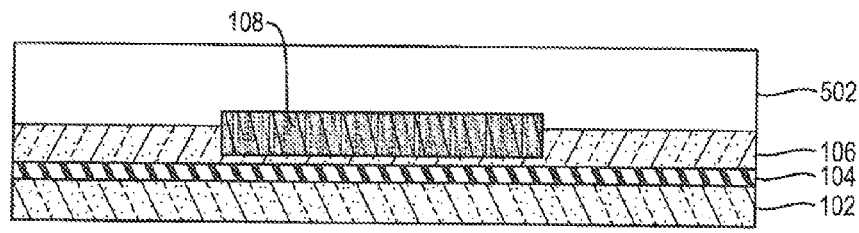
FIG. 13A is a side view of the protective layer installed over the waveguide and the germanium.
Figure 13B:
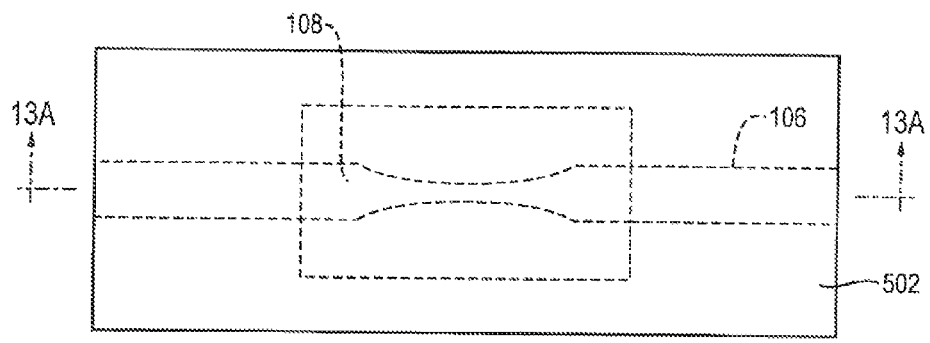
FIG. 13B is a top view of the protective layer installed over the waveguide and the germanium.
Figure 14A:
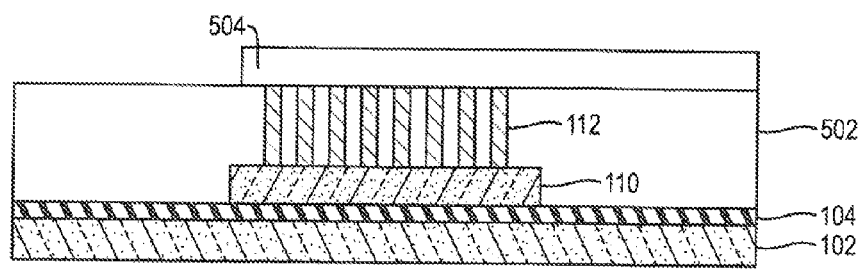
FIG. 14A is a side view of the photodetector with the electrical connections to the implant regions.
Figure 14B:
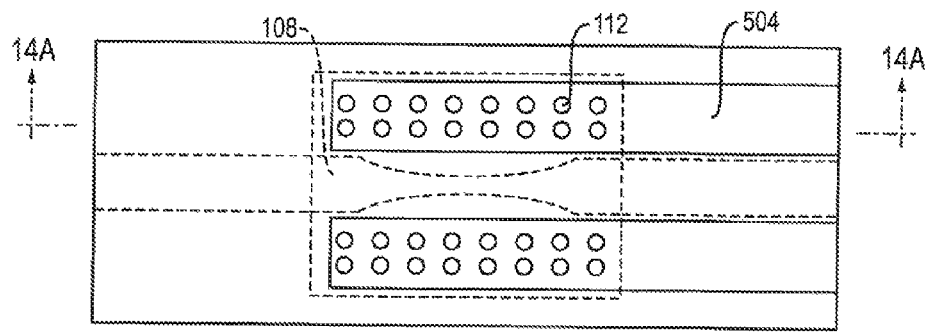
FIG. 14B is a top view of the germanium photodetector with the electrical connections to the implant regions.

Further teachings and descriptions of the methods for growing a quantity of germanium on a substrate are provided in the contents of U.S. Application Publication No. 2011/0036289 A1 filed Aug. 11, 2009, which is incorporated herein by reference. With the germanium layer grown, an additional TEOS layer may be deposited on the in-line germanium photodetector to provide a suitable structure for installing a quantity of metal contacts and electrical connections as shown in FIGS. 13A and 13B.

At Block 610 a quantity of electrical contacts are installed within the N-type and P-type implant regions of the photodetector. In the exemplary embodiment of the present disclosure, vias may be etched in the implant regions and filled with metal to form electrical connections. Attached to the electrical connections may be metal lines that allow the transfer of electrons from the photodetector device to other integrated circuit components. In the preferred embodiment of the present disclosure, the region implanted with N-type ions and the region implanted with P-type ions on both sides of the germanium are electrically connected to other circuit components. These electrical connections are accomplished by etching vias through the TEOS layer, depositing a liner, depositing a metal stud, and polishing the top of the stud. Metal lines connecting the top of the stud to the other electrical components are accomplished by depositing metal, patterning photoresist and then etching the metal lines.

The following is a description of a method for detecting an optical signal in an integrated circuit. The method includes the step of transmitting at least one optical signal through a waveguide wherein the optical signal contacts a germanium photodetector without terminating the optical signal.

The optical signal may be transmitted by another device or generated as part of the integrated circuit having the in-line germanium photodetector. The optical signal may be received by a waveguide that directs the optical signal towards the germanium photodetector. When the optical signal contacts the germanium photodetector, the signal is allowed to pass through the photodetector and continue traveling through the waveguide with minimal optical signal disturbance. The interaction between the optical signal and the germanium region of the photodetector is sufficient for inducing a measurable electric current indicating the presence of an optical signal. The optical signal upon passing through the waveguide and the germanium photodetector may then be applied to a second integrated circuit function.

In other embodiments of the present disclosure, the method for detecting an optical may also include a step of measuring a quantity of current generated when the optical signal interacts with the germanium region of the waveguide. In yet other embodiments, the method may include the step of creating an electric field by applying an external voltage across the germanium photodetector. The electric field having a strength that is inversely proportional the width of the germanium photodetector. Further embodiments may include the step of adjusting the sensitivity of the germanium photodetector by varying the external voltage applied across the germanium region of the photodetector. In some other embodiments of the present disclosure, the method may include a step for reducing a quantity of unwanted optical signal reflections by increasing the strength of the electric field. The strength of the electric field may be increased by applying an increasing amount of external voltage applied across the germanium region of the photodetector or reducing the width of the germanium region.

The subject matter of this disclosure may be implemented in a range of applications including but not limited to telecommunication and aerospace systems. The following is a description of a telecommunications system in accordance with the present disclosure. The system may include an integrated circuit having a waveguide for receiving and transmitting a quantity of optical signals. The waveguide has an optical pathway for transmitting a quantity of optical signals. A germanium photodetector is located in the optical pathway. The germanium photodetector detects the presence of at least one optical signal in the optical pathway of the waveguide without terminating the optical signal.

While the present disclosure has been described in connection with the preferred embodiments of the various figures, it is understood that other similar embodiments may be used or modifications or additions may be made to the described embodiments for performing the same function of the present disclosure without deviating therefrom. Therefore, the present disclosure should not be limited to any single embodiment, but rather construed in breadth and scope in accordance with the recitation of the appended claims.

It may be possible to execute the activities described herein in an order other than the order described. And, various activities described with respect to the methods identified herein can be executed in repetitive, serial, or parallel fashion.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

Referenced patents and applications identified in this disclosure are herein incorporated by reference in their entirety. Furthermore, where a definition or use of a term in a reference, which is incorporated by reference herein is inconsistent or contrary to the definition of that term provided herein, the definition of that term provided herein applies and the definition of that term in the reference does not apply.

Other embodiments will occur to those skilled in the art and are within the following claims.

What is claimed is:

1. A photodetector comprising:
   a waveguide having an optical pathway;
   a germanium region of the photodetector located in the optical pathway, wherein an optical signal is detected upon interacting with the germanium region of the photodetector and the optical signal passes through the waveguide; and
   at least two implant regions adjacent to the germanium region of the photodetector.

2. The photodetector of claim 1, wherein the optical signal passes through the waveguide by entering a first end of the waveguide and exiting through a second end of the waveguide.

3. The photodetector of claim 1, wherein the germanium region has width that is designed to achieve a desired electric field strength when a known voltage is applied across that germanium region.

4. The photodetector of claim 1, further comprising at least one interface between the germanium region of the photodetector and the waveguide, wherein the interface gradually transitions to reduce a quantity of unwanted optical signal reflections.

5. The photodetector of claim 4, wherein the interface is a location where the index of refraction changes between the waveguide having a first index of refraction value and the germanium region having a second index of refraction value.

6. A photodetector comprising:
   a waveguide having an optical pathway; and
   a germanium region of the photodetector located in the optical pathway, wherein an optical signal is detected upon interacting with the germanium region of the photodetector and the optical signal passes through the waveguide, wherein the germanium region has width that is designed to achieve a desired electric field strength when a known voltage is applied across that germanium region.

7. A telecommunications system comprising:
   an integrated circuit having a waveguide, wherein the waveguide has an optical pathway for transmitting a quantity of optical signals;
   a germanium photodetector located in the optical pathway, wherein the germanium photodetector detects the presence of at least one optical signal without terminating the optical signal; and
   at least two implant regions adjacent to the germanium photodetector.

8. A method for detecting an optical signal in an integrated circuit comprising:
   transmitting at least one optical signal through a waveguide wherein the optical signal interacts with a germanium region of a photodetector without terminating the optical signal; and
   creating an electric field by applying an external voltage across the germanium region of the photodetector, wherein the electric field has a strength that is inversely proportional to the width of the germanium region of the photodetector.

9. The method of claim 8, wherein the optical signal upon passing through the waveguide and the germanium photodetector may be applied to a secondary integrated circuit function.

10. The method of claim 8, further comprising detecting at least one optical signal by measuring a quantity of current generated when the optical signal interacts with the germanium region of the photodetector.

11. The method of claim 8, further comprising adjusting the sensitivity of the germanium photodetector by varying the external voltage applied across the germanium region of the photodetector.

12. The method of claim 8, further comprising reducing, a quantity of unwanted optical signal reflections by increasing the strength of the electric field.

13. The method of claim 12, wherein the strength of the electric field is increased by increasing the external voltage applied across the germanium region of the photodetector.

14. A photodetector comprising:
   a waveguide having an optical pathway;
   a germanium region of the photodetector located in the optical pathway, wherein an optical signal is detected upon interacting with the germanium region of the photodetector and the optical signal passes through the waveguide; and
   at least one interface between the germanium region of the photodetector and the waveguide, wherein the interface gradually transitions to reduce a quantity of unwanted optical signal reflections, and wherein the interface is a location where the index of refraction changes between the waveguide having a first index of refraction value and the germanium region having a second index of refraction value.

* * * * *